US 9,269,880 B2

(12) United States Patent
Brown-Shaklee et al.

(10) Patent No.: US 9,269,880 B2
(45) Date of Patent: Feb. 23, 2016

(54) HIGH ZT BISMUTH-DOPED PEROVSKITE THERMOELECTRICS

(71) Applicant: Sandia Corporation, Albuquerque, NM (US)

(72) Inventors: Harlan James Brown-Shaklee, Albuquerque, NM (US); Jon Ihlefeld, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 170 days.

(21) Appl. No.: 14/179,731

(22) Filed: Feb. 13, 2014

(65) Prior Publication Data

US 2014/0231696 A1 Aug. 21, 2014

Related U.S. Application Data

(60) Provisional application No. 61/765,227, filed on Feb. 15, 2013.

(51) Int. Cl.

| | |
|---|---|
| *H01L 35/18* | (2006.01) |
| *C04B 35/47* | (2006.01) |
| *H01L 35/22* | (2006.01) |
| *C04B 35/626* | (2006.01) |
| *C01G 23/00* | (2006.01) |

(52) U.S. Cl.
CPC .............. *H01L 35/18* (2013.01); *C01G 23/003* (2013.01); *C04B 35/47* (2013.01); *C04B 35/6268* (2013.01); *C04B 35/62675* (2013.01); *H01L 35/22* (2013.01); *C01P 2002/34* (2013.01); *C01P 2002/50* (2013.01); *C01P 2002/52* (2013.01); *C01P 2002/72* (2013.01); *C01P 2002/77* (2013.01); *C01P 2002/88* (2013.01); *C01P 2004/03* (2013.01); *C01P 2006/40* (2013.01); *C04B 2235/3227* (2013.01); *C04B 2235/3239* (2013.01); *C04B 2235/3241* (2013.01); *C04B 2235/3251* (2013.01); *C04B 2235/3258* (2013.01); *C04B 2235/3262* (2013.01); *C04B 2235/3298* (2013.01); *C04B 2235/652* (2013.01); *C04B 2235/656* (2013.01); *C04B 2235/658* (2013.01); *C04B 2235/6582* (2013.01); *C04B 2235/768* (2013.01)

(58) Field of Classification Search
CPC ........ H01L 35/22; C04B 35/47; C04B 35/65; C04B 41/009; C04B 2235/3213; C04B 2235/3227; C04B 2235/3232; C04B 2235/3298; C04B 2235/652; C04B 2235/6582; C04B 2235/6585; C04B 2235/664; C04B 2235/768
See application file for complete search history.

(56) References Cited

U.S. PATENT DOCUMENTS

2010/0051079 A1* 3/2010 Majumdar et al. ...... H01L 35/22
 136/201

OTHER PUBLICATIONS

Ravichandran, J. et al., High-temperature thermoelectric response of double-doped SrTiO3 epitaxial films, Physical Review B 82, pp. 165126-1-165126-5 (2010).

(Continued)

*Primary Examiner* — Carol M Koslow
(74) *Attorney, Agent, or Firm* — Kevin W. Bieg

(57) ABSTRACT

A bismuth-doped perovskite thermoelectric, comprising $(Bi_x, La_{0.1-x})SrTiO_3$, wherein x is between 0.01 and 0.1, can have a high figure-of-merit, ZT.

1 Claim, 12 Drawing Sheets

(56) References Cited

OTHER PUBLICATIONS

Brennecka, G.L. et al., Processing Technologies for High-Permittivity Thin Films in Capacitor Applications, J. Am. Ceram. Soc. 93, pp. 3935-3954 (2010).

Aygun, S.M. et al., Permittivity scaling in Ba1-xSrxTiO3 thin films and ceramics, Journal of Applied Physics 109, pp. 034108-1-034108-5 (2011).

* cited by examiner

HIGH ZT BISMUTH-DOPED PEROVSKITE THERMOELECTRICS

CROSS-REFERENCE TO RELATED APPLICATION

This application claims the benefit of U.S. Provisional Application No. 61/765,227, filed Feb. 15, 2013, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to thermoelectrics and, in particular, to high ZT bismuth-doped perovskite thermoelectrics.

BACKGROUND OF THE INVENTION

The thermoelectric effect refers to phenomena by which either a temperature difference creates an electric potential or an electric potential creates a temperature difference. Thermoelectric materials show the thermoelectric effect in a strong or convenient form. Thermoelectric performance is defined by a dimensionless figure-of-merit $ZT=(\sigma S^2 T/\kappa)$, where $\sigma$ is electrical conductivity (S m$^{-1}$), S is the Seebeck coefficient (V K$^{-1}$), and $\kappa$ is thermal conductivity (W m$^{-1}$ K$^{-1}$). Therefore, by going to much higher temperatures, ZT can be substantially increased. The power factor, $PF=\sigma S^2$, can be optimized by modifying the composition and crystallinity of the material. In particular, without a high degree of crystallization, ZT for thermoelectric materials tends to be unacceptably low due to deleterious effects to the power factor. Low-cost materials that have a sufficiently strong thermoelectric effect can be used in many applications, including power generation and refrigeration.

Metal oxide ceramics have recently garnered increased interest as thermoelectric materials for high-temperature energy harvesting applications. In particular, perovskites, including $CaTiO_3$, $SrTiO_3$, and $BaTiO_3$ are interesting candidates for thermoelectrics because their electrical and thermal behavior can be tailored with A-site and B-site dopants. Further, the perovskites can accommodate multiple dopant atoms that can be used to reduce phonon heat transport while simultaneously creating defect states below conduction band.

However, a need remains to identify methodologies for reducing thermal conductivity without sacrificing thermopower and electrical conductivity of bulk oxides.

SUMMARY OF THE INVENTION

The present invention is directed to a bismuth-doped perovskite thermoelectric, comprising $(Bi_x, La_{0.1-x})SrTiO_3$, wherein x is between 0.01 and 0.1, that can have a high thermoelectric figure-of-merit.

BRIEF DESCRIPTION OF THE DRAWINGS

The detailed description will refer to the following drawings, wherein like elements are referred to by like numbers.

DETAILED DESCRIPTION OF THE INVENTION

A perovskite structure is any material with the same type of crystal structure as calcium titanium oxide ($CaTiO_3$). The perovskite structure is adopted by many oxides that have the formula $ABO_3$, where 'A' and 'B' are two cations of very different sizes, and the oxygen anion bonds to both. The ideal cubic-symmetry structure has the B-site cation in 6-fold coordination, surrounded by an octahedron of oxygen anions, and the A-site cation in 12-fold cuboctahedral coordination. The relative ion size requirements for stability of the cubic structure are quite stringent, so slight buckling and distortion, for example via doping, can produce several lower-symmetry distorted versions, in which the coordination numbers of the A cations, B cations, or both are reduced.

Figure 1:
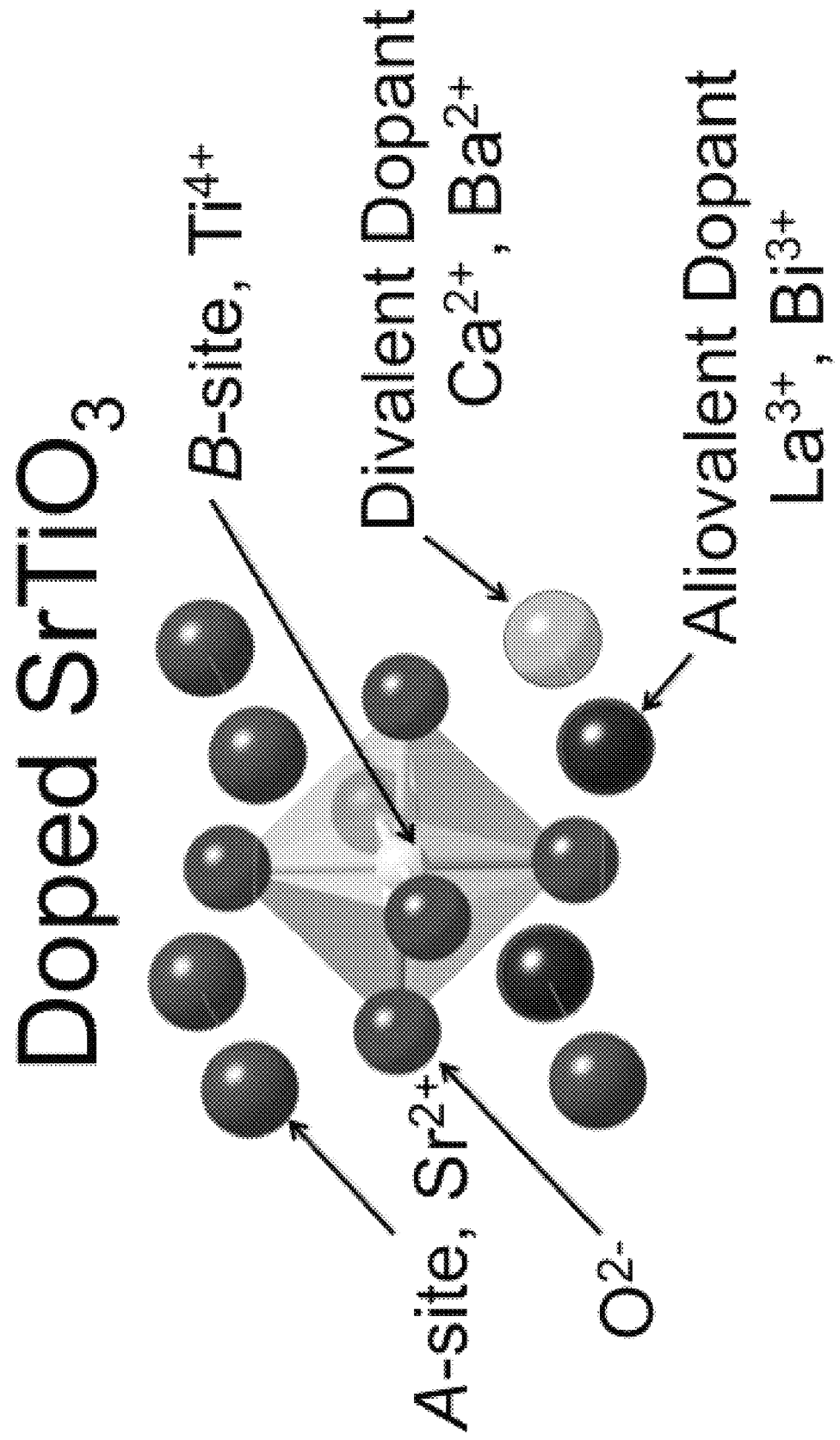
FIG. 1 is an illustration of the cubic perovskite structure for doped $SrTiO_3$.

Strontium titanate ($SrTiO_3$; STO) is a large band-gap perovskite oxide that can be easily doped at the A and B cationic sites. FIG. 1 shows the cubic perovskite structure for doped $SrTiO_3$, with $Ti^{4+}$ occupying the B-site, $Sr^{2+}$ occupying the A-site, and divalent dopants ($Ca^{2+}$, $Ba^{2+}$) and aliovalent dopants ($La^{3+}$, $Bi^{3+}$) substituted at the A-sites. The large orbital degeneracy of titanium d-band carriers results in large power factors. See Ravichandran et al., *Phys. Rev. B* 82, 165126 (2010).

This invention is directed to the thermoelectric performance of bismuth-doped perovskites and, more particularly, to (Bi, La)-doped $SrTiO_3$ wherein the lanthanum dopant is partially substituted with bismuth. La-doped $SrTiO_3$ (La-STO) is a promising n-type thermoelectric material due to its combination of high thermopower ($S_{300K}$~90 μV/K) and electrical conductivity ($\sigma_{300K}$~1200 S/cm). Typically, the thermal conductivity of La-STO is ~5-5.5 W/m-K at room temperature which limits its applicability as a high ZT thermoelectric. According to the present invention, the replacement of small amounts of $La^{3+}$ with $Bi^{3+}$ increases the Seebeck coefficient and decreases the thermal conductivity of reduced La-STO. As described below, laboratory scale specimens with nominal compositions of $(Bi_x, La_{0.1-x}, Sr_{0.9}) TiO_3$ and $(Bi_x, La_{0.2-x}, Sr_{0.8})TiO_3$ were evaluated for thermal conductivity, electrical conductivity and Seebeck coefficient. Additional compositions that utilize B-site dopants (Mn, Nb, Ta, W, V, Cr, etc.) for titanium can also be used.

These compositions can be manufactured by many methods including solid state, liquid state, and gaseous phase synthesis. These materials can be made into single crystals, thin films, bulk ceramics, or nano-structures by methods including but not limited to sintering, melt fusion, chemical solution deposition (CSD), reactive sputtering, physical vapor deposition, atomic layer deposition, chemical vapor deposition, and pulsed laser deposition. In particular, CSD is a technique that can produce large quantities of nanograined material quickly and inexpensively. See Brennecka et al., *J. Amer. Ceram. Soc.* 93, 3935 (2010), which is incorporated herein by reference. However, achieving fully dense crystalline films with CSD can be challenging due to remnant organic material inhibiting complete crystallization. See Aygun et al., *J. Appl. Phys.* 109, 034108 (2011). As examples of the invention, bulk ceramics and CSD thin films are described below Polycrystalline nano-$SrTiO_3$ thin films were prepared by CSD using 0.15M chelate chemistry with methanol solvent. The films were spin cast and every layer was crystallized at 700° C. on 0001-oriented sapphire substrates. The cast films were additionally heat treated for one-half hour in air at high temperature to coarsen the microstructure.

Figure 2:
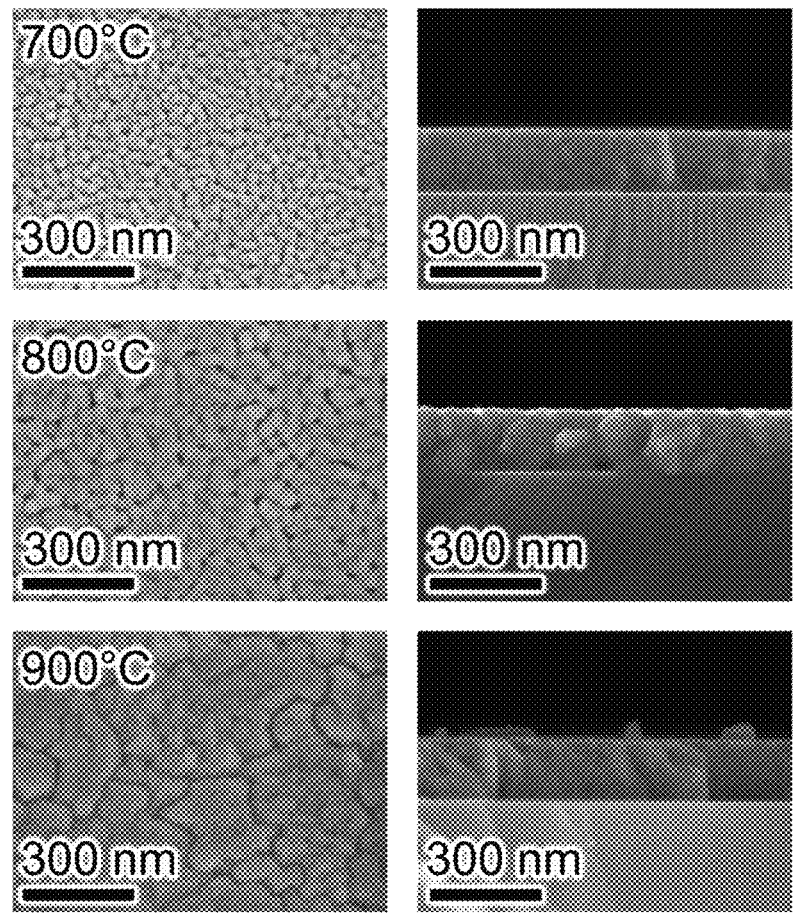
FIG. 2 shows scanning electron micrographs (SEMS) of thin film microstructures after annealing at 700-900° C.

FIG. 2 shows SEMS of the microstructures of the $SrTiO_3$ films after annealing at 700-900° C.

Figure 3:
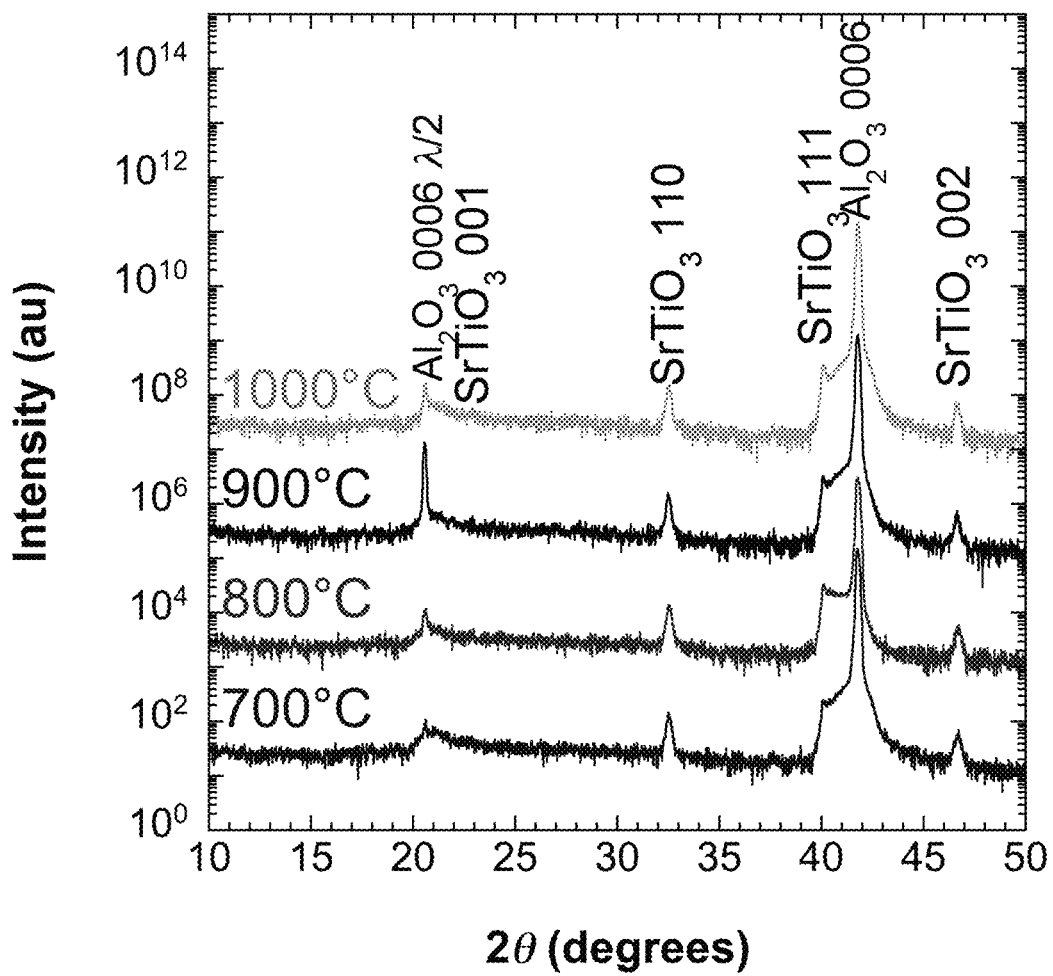
FIG. 3 shows x-ray diffraction (XRD) patterns for $SrTiO_3$ films annealed at high temperatures.

FIG. 3 shows XRD patterns that confirm the crystallinity of the $SrTiO_3$ annealed at 700 to 1000° C.

Figure 4:
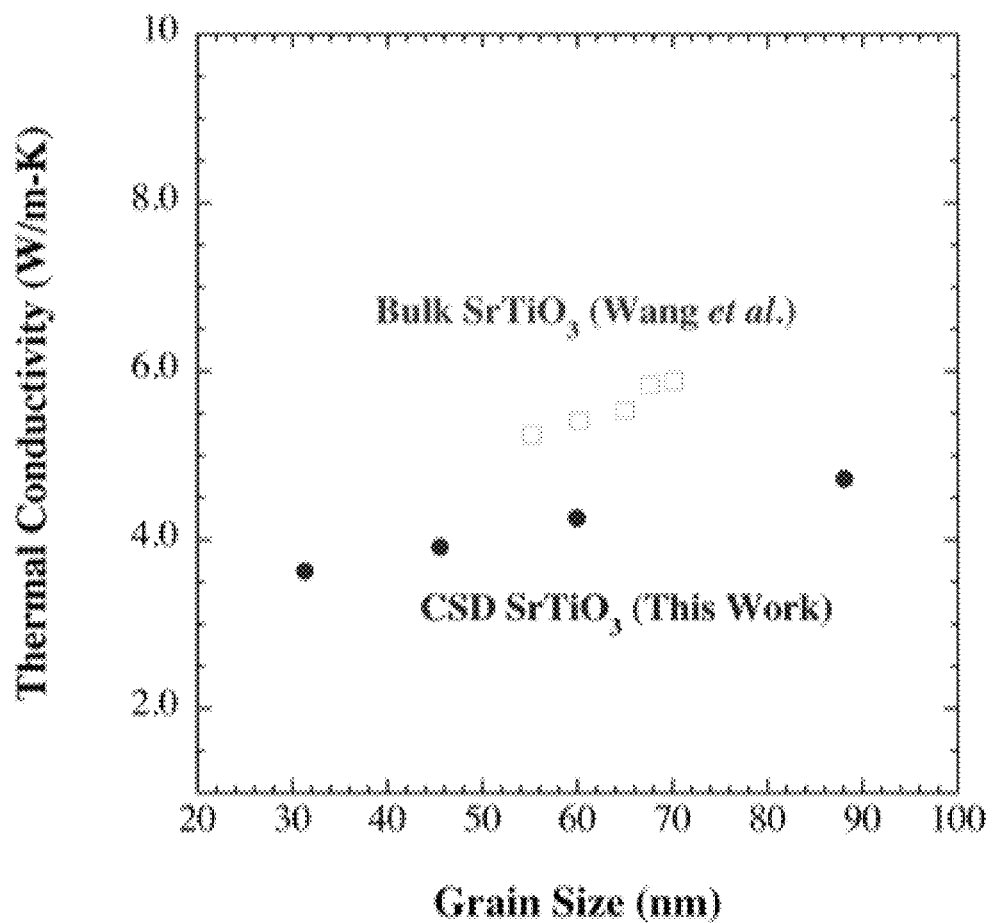
FIG. 4 is a graph of the thermal conductivity as a function of grain size for bulk $SrTiO_3$ and CSD $SrTiO_3$ thin films.

FIG. 4 is a graph of the thermal conductivity as a function of grain size for bulk $SrTiO_3$ and CSD $SrTiO_3$ thin films. The nano-grained $SrTiO_3$ thin films exhibit reduced thermal conductivity values compared to literature values for bulk $SrTiO_3$, suggesting that the thermoelectric figure-of-merit can be further improved with grain size reduction.

Bulk (Bi, La)-STO thermoelectrics were produced by reacting a homogenous mixture of $SrCO_3$, $La_2O_3$, $Bi_2O_3$, and $TiO_2$ at an elevated temperature (1200° C.) under an oxidizing atmosphere. (Bi, La)-doped $SrTiO_3$ samples were prepared by milling the metal oxides and carbonates in ethanol and calcining under flowing $O_2$ or Ar/3% $H_2$. The calcined powders were then ground and pelletized. The ceramics were sintered and post heat treated under flowing Ar/3% $H_2$ to generate conductive n-type $SrTiO_3$ ceramics.

Figure 5:
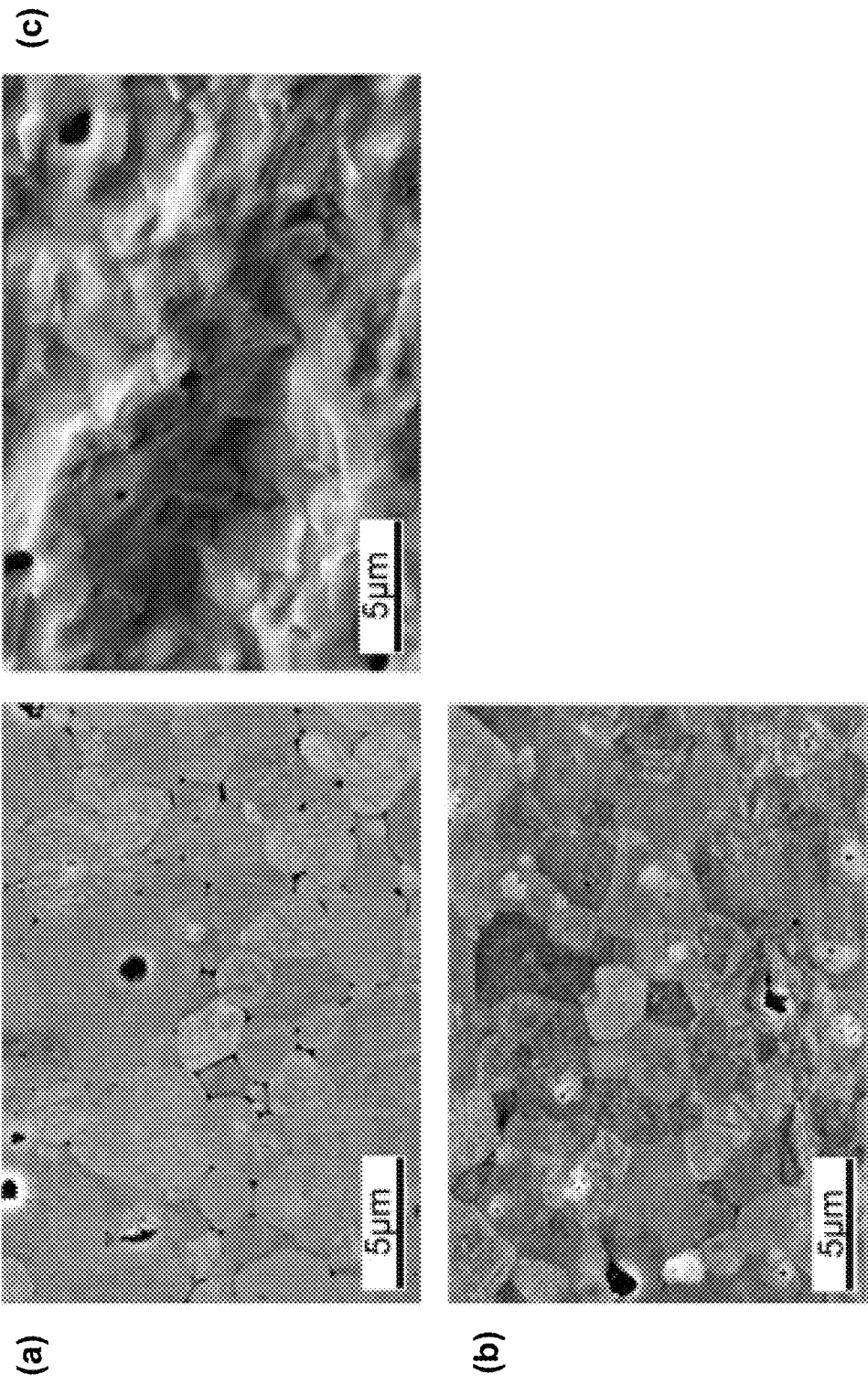
FIG. 5(a) is an SEM of the microstructure of bulk $(La_{0.1}, Sr_{0.9})TiO_3$ calcined in $O_2$.
FIG. 5(b) is an SEM of the microstructure of bulk $(La_{0.1}, Sr_{0.9}) TiO_3$ calcined in $H_2$.
FIG. 5(c) is an SEM of the fracture surface.

The calcination atmosphere influenced the sintered microstructure. FIG. 5(a) is an SEM of the microstructure of bulk $(La_{0.1}, Sr_{0.9}) TiO_3$ calcined in $O_2$. FIG. 5(b) is an SEM of the microstructure of bulk $(La_{0.1}, Sr_{0.9}) TiO_3$ calcined in $H_2$. FIG. 5(c) is an SEM of the fracture surface. Powders calcined in flowing $O_2$ reached higher densities that those calcined in Ar/3% $H_2$.

After calcination, the powders were ground and compacted with or without an organic binder to form uniform ceramic green bodies. These green bodies were then heated to a sintering temperature required to facilitate densification in flowing $O_2$. Typically, the sintering temperature required to densify the powder generated by calcination exceeded 1400° C. A number of sintering conditions can be used to control microstructure, and thus, thermoelectric performance of the final component. After sintering, the dense ceramic was sectioned into the desired geometries required for testing by diamond machining and heat treated in Ar/3% $H_2$ to facilitate reduction. This reduction step is preferred to achieve the desired thermoelectric performance and can be accomplished using reducing gas mixtures of $CO/CO_2$, $Ar/H_2$, $N_2/H_2$, and the like. The duration and temperature of the reduction step is an important variable that impacts the thermoelectric performance of the material. Heat treatment of (Bi, La)-doped $SrTiO_3$ in reducing atmospheres produced Bi-rich and Ti-rich precipitates. Precipitation of Bi and $TiO_2$ causes a decrease in carrier concentration.

Figure 6:
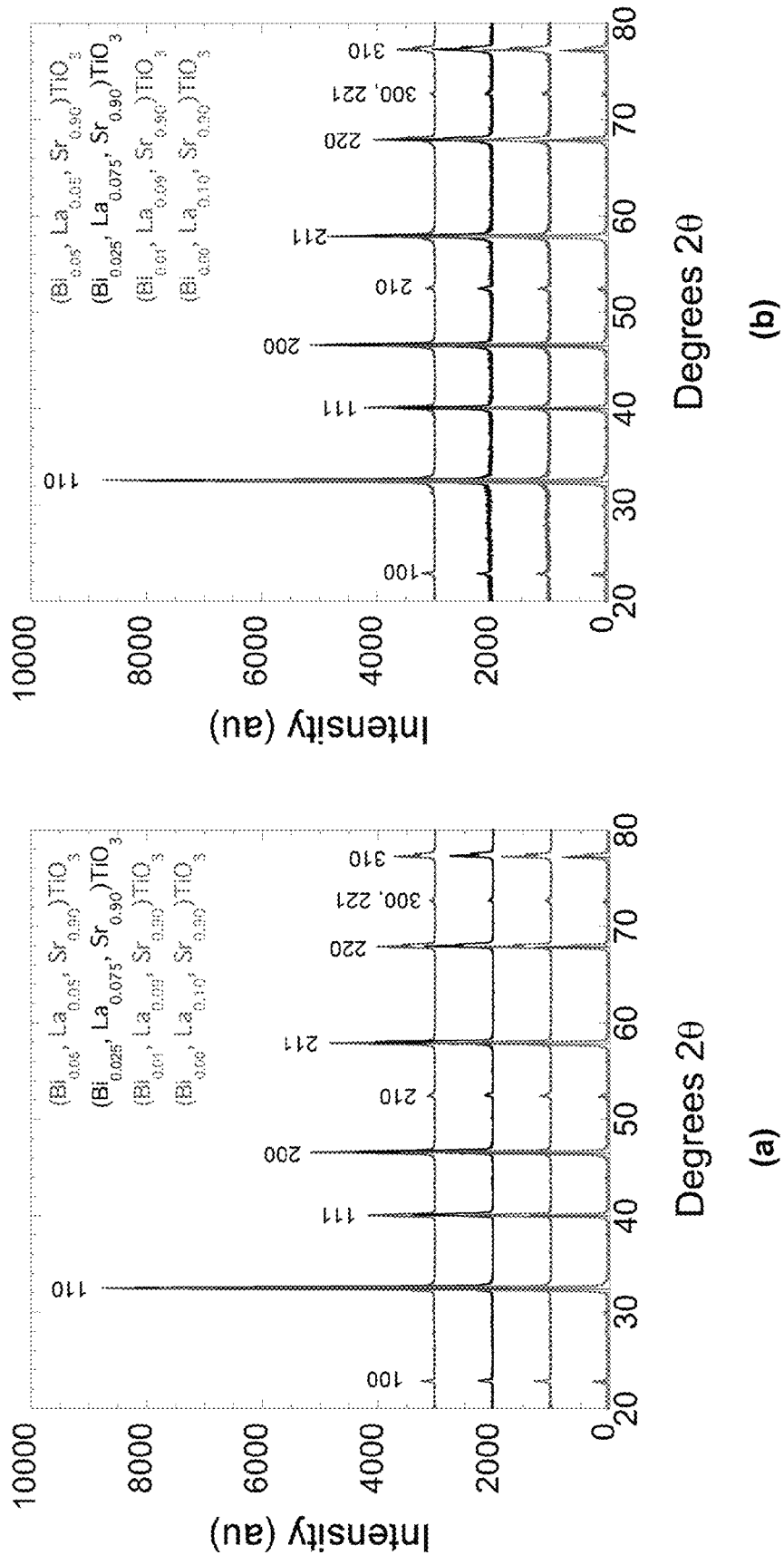
FIGS. 6(a) and 6(b) are XRD patterns for calcined powders and reduced ceramics of (Bi, La)-STO.

FIGS. 6(a) and 6(b) show XRD patterns that were collected from calcined powders and reduced ceramics of (Bi, La)-STO containing 10 mol. % total dopant, respectively. These patterns indicate that a single phase solid solution with cubic symmetry was formed during calcination at 1200° C. Further, bismuth A-site dopants can be used to replace lanthanum and still maintain the cubic perovskite structure.

Figure 7:
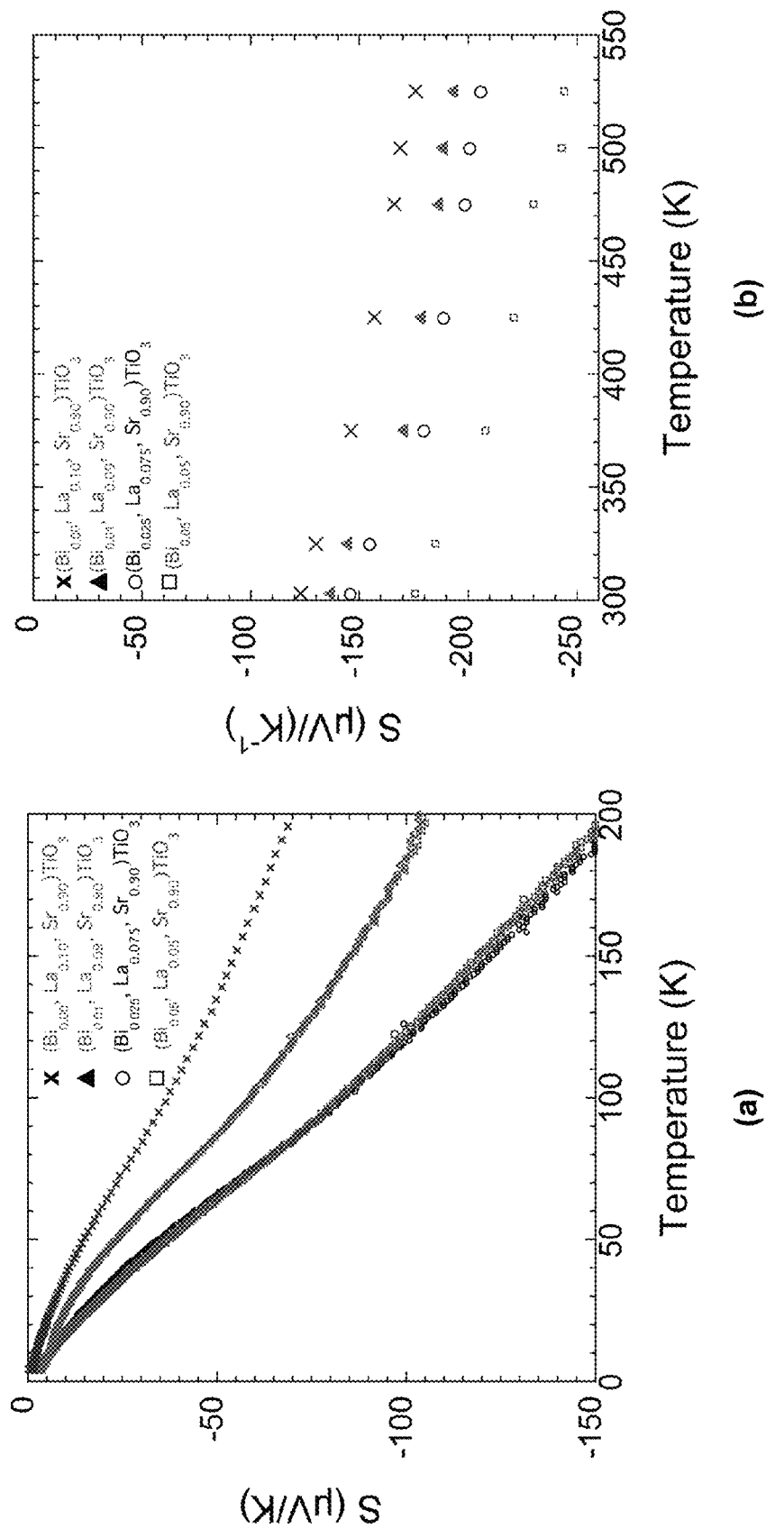
FIG. 7(a) is a graph of the subambient temperature dependence of Seebeck coefficient for (Bi, La)-STO thermoelectrics containing 10 mol. % total dopant.
FIG. 7(b) is a graph of the temperature dependence from 300 to 550K of Seebeck coefficient for (Bi, La)-STO thermoelectrics containing 10 mol. % total dopant.
Figure 8:
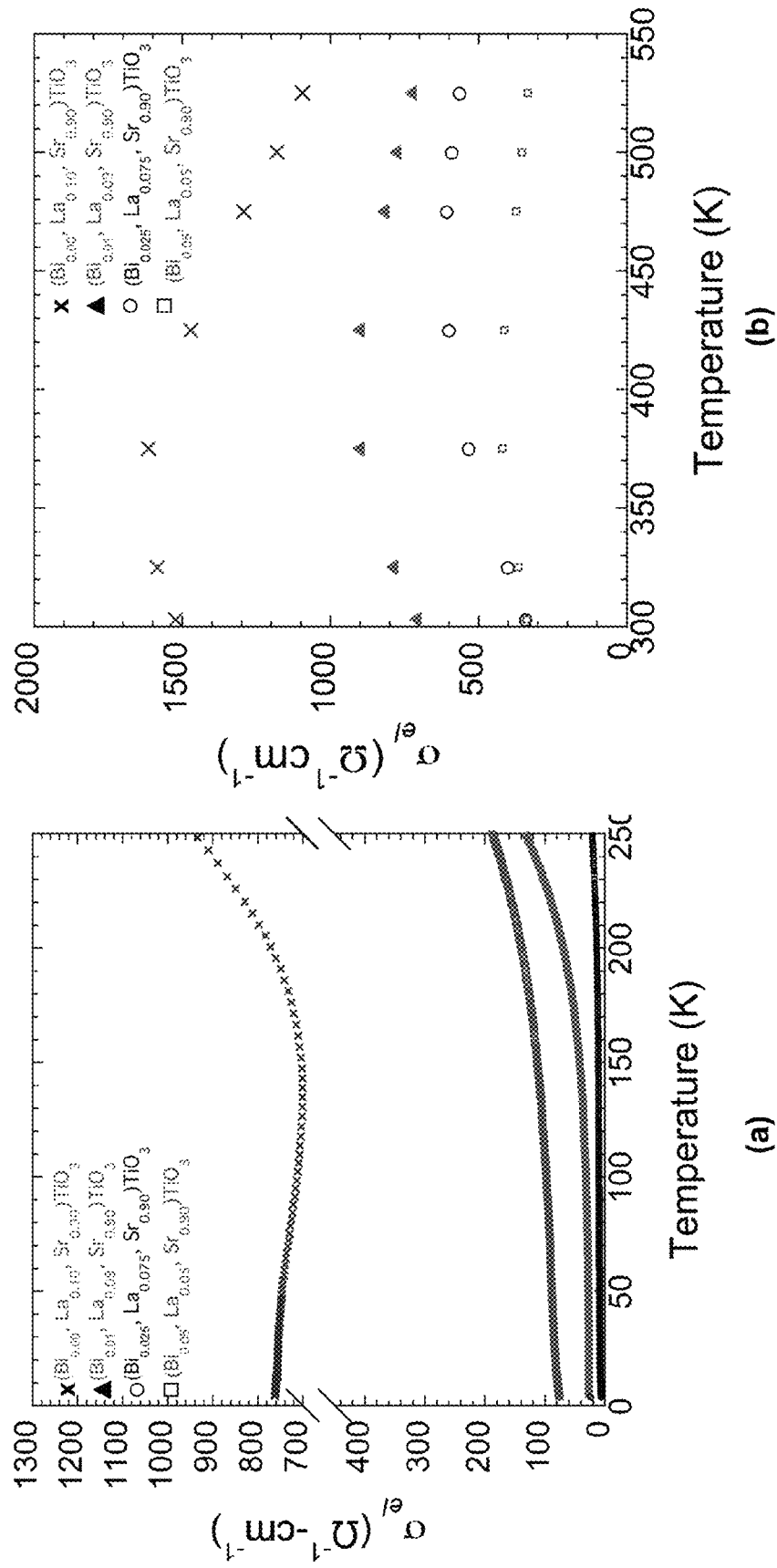
FIG. 8(a) is a graph of the subambient temperature dependence of the electrical conductivity for (Bi, La)-STO thermoelectrics containing 10 mol. % total dopant.
FIG. 8(b) is a graph of the temperature dependence from 300 to 550K of the electrical conductivity for (Bi, La)-STO thermoelectrics containing 10 mol. % total dopant.
Figure 9:
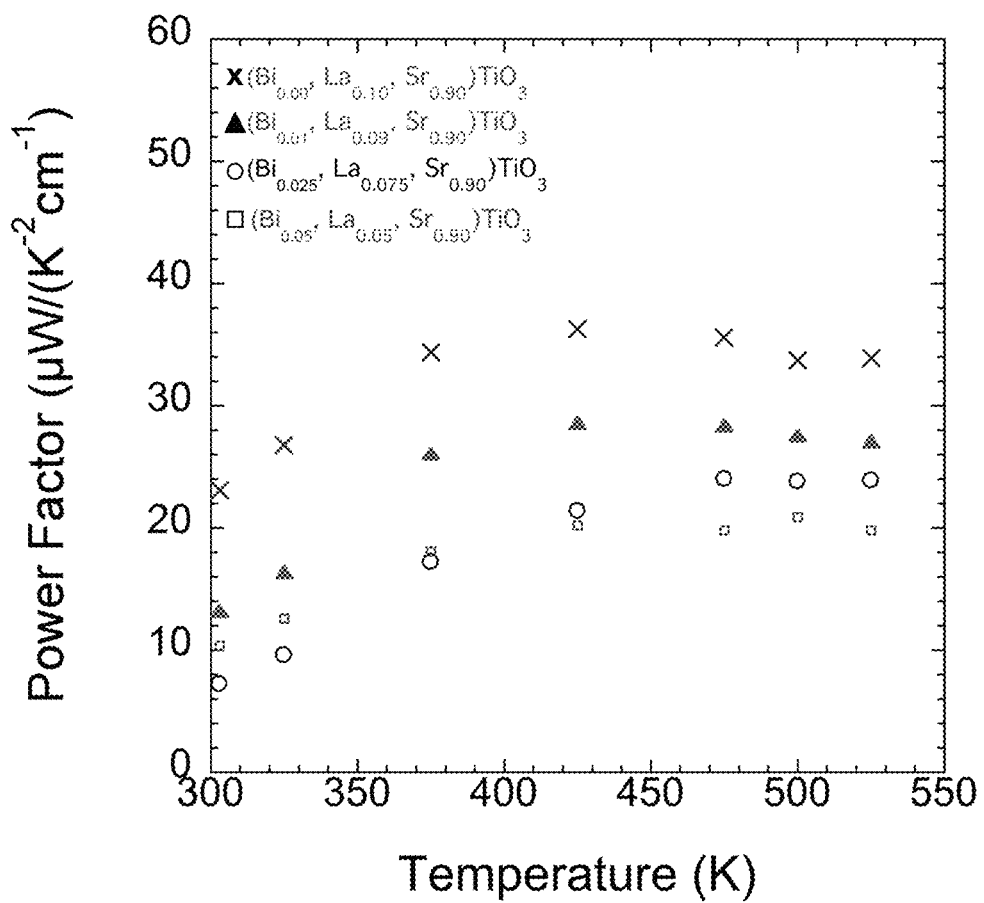
FIG. 9 is a graph of the power factor as a function temperature from 300 to 550K for (Bi, La)-STO thermoelectrics containing 10 mol. % total dopant.
Figure 10:
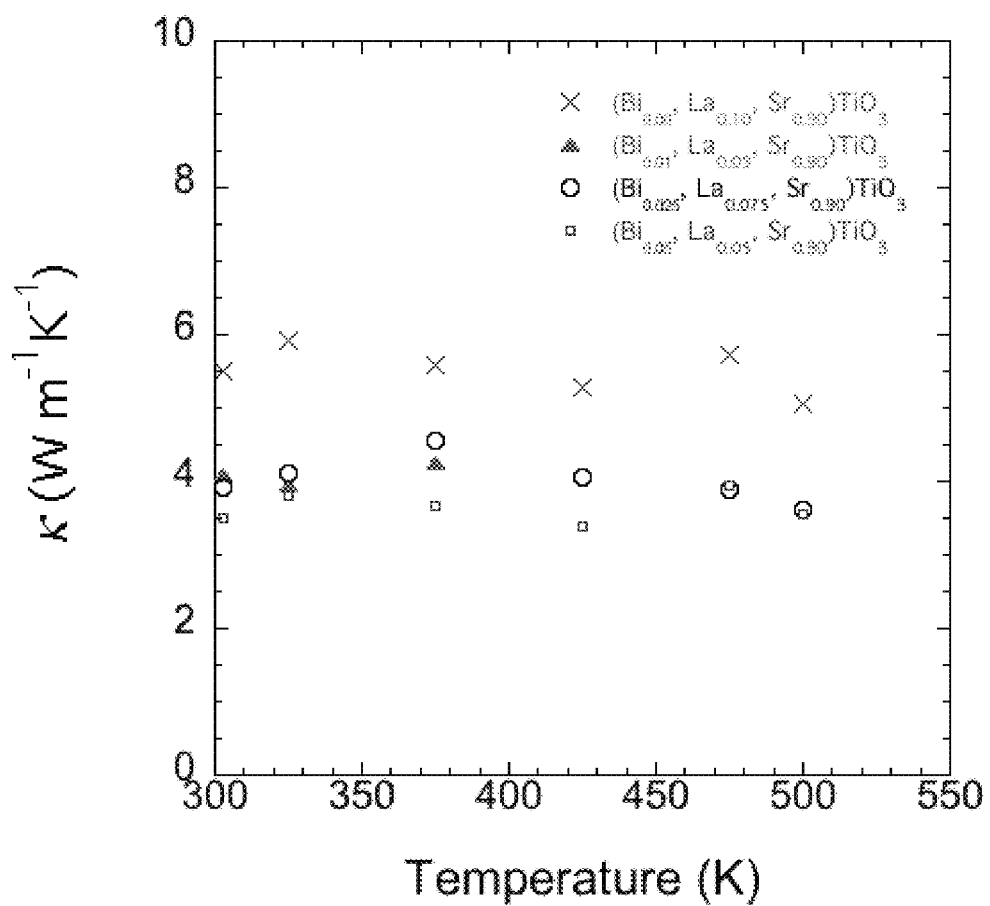
FIG. 10 is a graph of the thermal conductivity of Bi-doped La-STO at elevated temperature as a function of bismuth doping.
Figure 11:
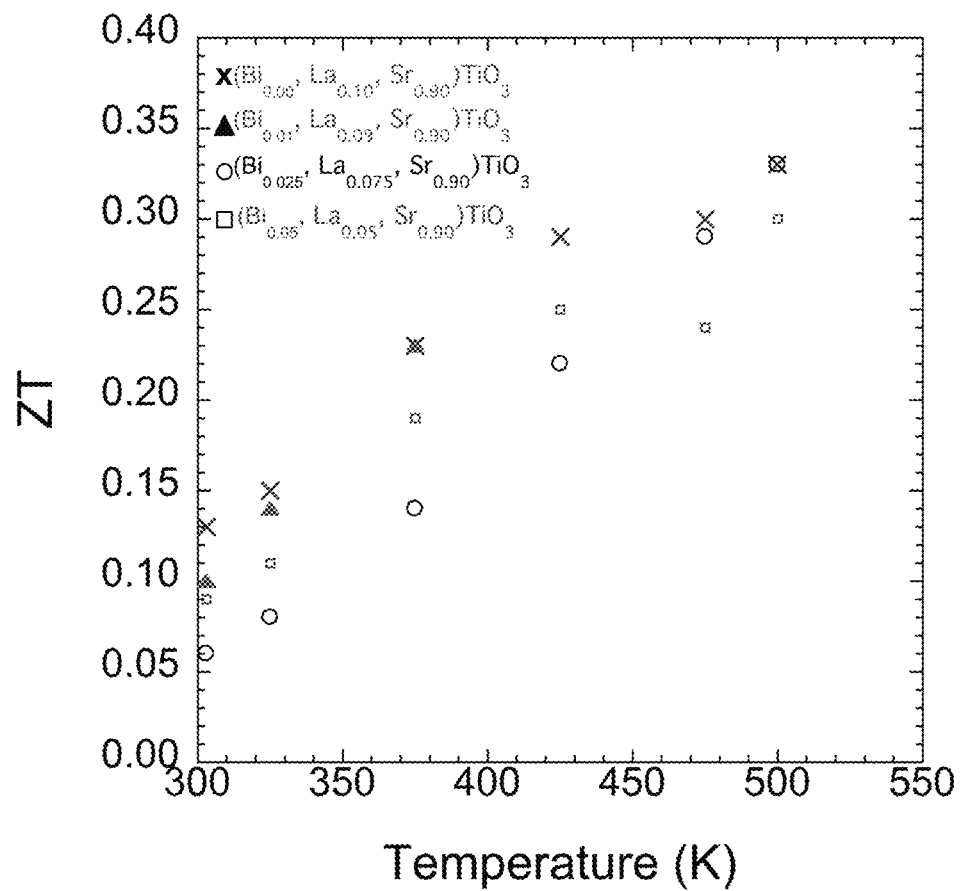
FIG. 11 is a graph of ZT as a function of temperature of Bi-doped La-STO at elevated temperature.

Time domain thermoreflectance (TDTR) was used to characterize thermal conductivities of films and bulk ceramics. See Cahill et al., *Rev. Sci. Inst.* 75, 5119 (2004); and Hopkins et al., *J. Heat Trans.* 132, 081302 (2010). The amount of bismuth dopant in the La-STO influences the thermoelectric performance. FIG. 7(a) shows the temperature dependence of Seebeck coefficient at subambient temperatures for samples containing 10 mol. % total dopant. FIG. 7(b) shows a similar plot for temperatures from 300 to 550K. FIG. 8(a) shows the temperature dependence of the electrical conductivity at subambient temperatures for samples containing 10 mol. % total dopant. FIG. 8(b) shows a similar plot for temperatures from 300 to 550K. The temperature dependent power factor can be calculated from Seebeck coefficient and electrical conductivity. FIG. 9 shows the change in power factor as a function temperature and composition. FIG. 10 shows the thermal conductivity of Bi-doped La-STO at elevated temperature as a function of bismuth doping. Bismuth effectively reduced thermal conductivity when it replaced lanthanum. Small changes in bismuth content (as low as 1%) reduce the thermal conductivity of the La-STO from 5-5.5 W/m-K to ~3.5-4 W/m-K at 300K. The dimensionless figure-of-merit $ZT=(\sigma S^2 T/\kappa)$ can be calculated from the power factor and thermal conductivity at a given temperature. FIG. 11 shows ZT as a function of temperature temperatures from 300 to 550K for (Bi, La)-STO samples containing 10 mol. % total dopant. Favorable power factor and figure-of-merit values were obtained for (Bi, La)—$SrTiO_3$ despite a drop in $\sigma_{el}$ with respect to La—$SrTiO_3$. As a result of the higher thermopower (S) and lower thermal conductivity ($k_{th}$), the composition $(Bi_{0.01}, La_{0.09}, Sr_{0.90}) TiO_3$ has a $ZT_{300K}$=0.10 compared to $ZT_{300K}$=0.15 for La-STO. Lower thermal conductivity will be important to realize compact modules (high power density) with very high ΔT values. High achievable ΔT will provide higher power modules in a smaller volume which makes control of thermal conductivity necessary.

Figure 12:
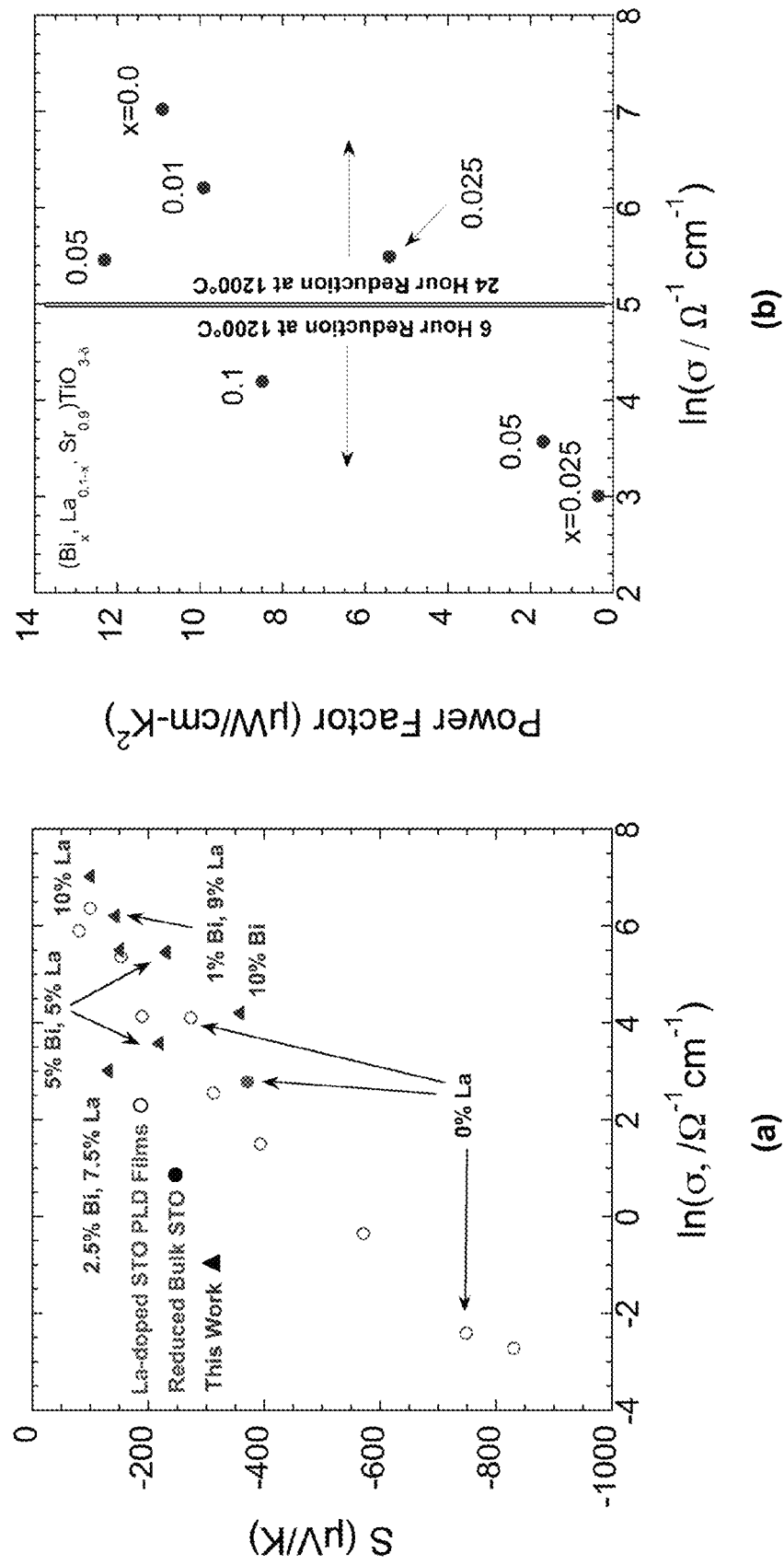
FIG. 12(a) is a Jonker plot of S vs. log $\sigma$.
FIG. 12(b) is a plot of PF vs. log $\sigma$.

A Jonker analysis enables the determination of electrical properties from which the maximum achievable PF can be predicted. FIG. 12(a) shows a Jonker plot of S vs. log σ. See J. Ravichandran et al., *Phys. Rev. B* 83, 035101 (2011); and S. Lee et al., *Phys. Rev. B* 79, 134110 (2009). FIG. 12(b) shows a plot of PF vs. log σ. Post sintering reduction conditions of (Bi, La)—SrTiO$_3$ contributed heavily to $\sigma_{el}$, S, and the resulting power factors.

The thermoelectric performance of the (Bi, La)—SrTiO$_3$ for various bismuth concentrations Is summarized at 300K in Table 1 and at 500K in Table 2.

TABLE 1

Thermoelectric performance of (Bi, La)-SrTiO3 at 300K.

| Bi (%) | La (%) | S (μV/K) | $\sigma_{el}$ (W-cm)$^{-1}$ | $k_{th}$ (W/m-K) | PF (μW/cm-K$^2$) | ZT |
|---|---|---|---|---|---|---|
| 0 | 10 | −123 | 1524 | 5.49 | 23.0 | 0.15 |
| 1 | 9 | −136 | 714 | 4.07 | 13.2 | 0.10 |
| 2.5 | 7.5 | −146 | 339 | 3.93 | 7.2 | 0.06 |
| 5 | 5 | −175 | 337 | 3.59 | 10.4 | 0.09 |

TABLE 2

Thermoelectric performance of (Bi, La)-SrTiO3 at 500K.

| Bi (%) | La (%) | S (μV/K) | $\sigma_{el}$ (W-cm)$^{-1}$ | $k_{th}$ (W/m-K) | PF (μW/cm-K$^2$) | ZT |
|---|---|---|---|---|---|---|
| 0 | 10 | −169 | 1180 | 5.0 | 33.7 | 0.33 |
| 1 | 9 | −188 | 780 | — | 27.6 | — |
| 2.5 | 7.5 | −201 | 589 | 3.6 | 23.8 | 0.33 |
| 5 | 5 | −243 | 354 | 3.5 | 20.9 | 0.30 |

The present invention has been described as high ZT bismuth-doped bulk perovskite thermoelectrics. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A high-ZT bismuth-doped perovskite thermoelectric, comprising (Bi$_x$La$_{0.1-x}$Sr$_{0.9}$)TiO$_3$, wherein x is between 0.01 and 0.1.

* * * * *